(12) United States Patent
Lin

(10) Patent No.: US 10,622,314 B2
(45) Date of Patent: Apr. 14, 2020

(54) CHIP PACKAGE STRUCTURE

(71) Applicant: MStar Semiconductor, Inc., Hsinchu Hsien (TW)

(72) Inventor: You-Wei Lin, Hsinchu Hsien (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/040,862

(22) Filed: Jul. 20, 2018

(65) Prior Publication Data

US 2019/0181100 A1  Jun. 13, 2019

Related U.S. Application Data

(60) Provisional application No. 62/595,596, filed on Dec. 7, 2017.

(51) Int. Cl.
*H01L 23/00* (2006.01)
*H01L 23/31* (2006.01)
*H01L 23/16* (2006.01)

(52) U.S. Cl.
CPC ............ *H01L 23/562* (2013.01); *H01L 23/16* (2013.01); *H01L 23/3114* (2013.01); *H01L 23/3121* (2013.01); *H01L 24/16* (2013.01); *H01L 24/48* (2013.01); *H01L 24/49* (2013.01); *H01L 2224/16225* (2013.01); *H01L 2224/16227* (2013.01); *H01L 2224/48091* (2013.01); *H01L 2224/48227* (2013.01); *H01L 2224/49171* (2013.01); *H01L 2924/00014* (2013.01); *H01L 2924/15174* (2013.01); *H01L 2924/181* (2013.01); *H01L 2924/19105* (2013.01); *H01L 2924/3511* (2013.01)

(58) Field of Classification Search
CPC ................................................ H01L 23/49541
See application file for complete search history.

(56) References Cited

U.S. PATENT DOCUMENTS

| 8,390,108 | B2 | 3/2013 | Cho et al. |
| 9,673,124 | B2 | 6/2017 | Wang et al. |
| 9,859,203 | B2 * | 1/2018 | Kim ................. H01L 23/49827 |
| 9,941,108 | B2 | 4/2018 | Kim et al. |
| 2012/0205790 | A1 * | 8/2012 | Haga .................. H01L 23/4827 |
| | | | 257/762 |

FOREIGN PATENT DOCUMENTS

| TW | 200739760 A | 10/2007 |
| TW | 201131696 A1 | 9/2011 |
| TW | 201316462 A1 | 4/2013 |
| TW | 201606887 A | 2/2016 |
| TW | 201715671 A | 5/2017 |
| TW | 201721816 A | 6/2017 |

* cited by examiner

*Primary Examiner* — Thao P Le

(74) *Attorney, Agent, or Firm* — McClure, Qualey & Rodack, LLP

(57) ABSTRACT

A chip package structure includes a substrate, a die, a plurality of warpage retainers, and an encapsulant. The substrate has a surface, on which the die is provided. The warpage retainers are provided at at least one corner of the substrate. The encapsulant covers the surface of the substrate, the die and the warpage retainers.

12 Claims, 4 Drawing Sheets

CHIP PACKAGE STRUCTURE

This application claims the benefit of U.S. Provisional Application Ser. No. 62/595,596, filed on Dec. 27, 2017, the subject matter of which is incorporated herein by reference.

BACKGROUND OF THE INVENTION

Field of the Invention

The invention relates in general to a chip package structure, and more particularly to a chip package structure comprising warpage retainers.

Description of the Related Art

Semiconductor packaging is a technology for encapsulating one or more dies into one body, and provides the die(s) with protection to a certain extent against shock or friction. FIG. 1 shows a schematic section view of a conventional chip package structure. As shown in FIG. 1, in the conventional chip package structure 10, an encapsulant 18 for encapsulating a die 14 and a substrate 12 carrying the die need to be tightly bonded to each other to provide the die 14 with sufficient protection. However, the encapsulant 18 and the substrate 12 in the chip package structure 10 have different coefficients of thermal expansion. After a high-temperature process such as die bonding the chip package structure 10 to other devices, warpage may occur in the chip package structure 10, leading to air welding or bridging, and hence damage or malfunction of the die 14 in the chip package structure 10.

SUMMARY OF THE INVENTION

It is an object of the present invention to provide a chip package structure to retain warpage caused by a high-temperature process.

According to an embodiment of the present invention, a chip package structure includes a substrate, a die, a plurality of warpage retainers and an encapsulant. The substrate has a surface, on which the die is provided. The warpage retainers are provided at at least one corner of the surface of the substrate. The encapsulant covers the surface of the substrate, the die and the warpage retainers.

The above and other aspects of the invention will become better understood with regard to the following detailed description of the but non-limiting embodiments. The following description is made with reference to the accompanying drawings.

DETAILED DESCRIPTION OF THE INVENTION

Figure 1:
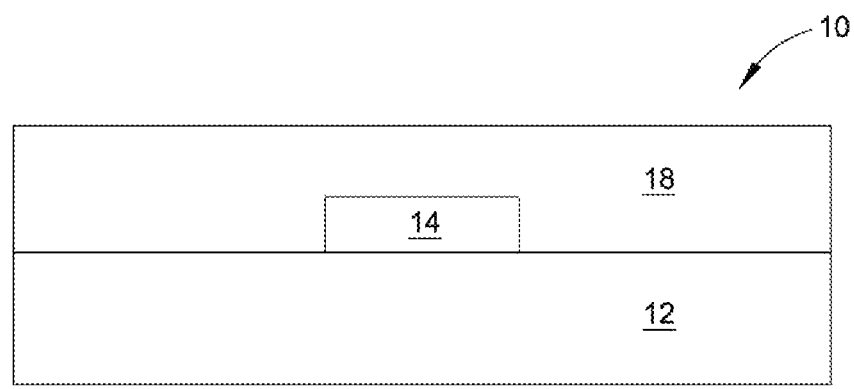
FIG. 1 is a schematic section view of a conventional chip package structure.

To enable a person skilled in the art to better understand the present invention, embodiments of the present invention are given with the accompanying drawings below to further illustrate the content and expected function of the present invention. To keep the drawings simple and easily understandable, the drawings are not depicted to actual sizes or ratios, and the sizes and proportions in the drawings are only illustrative and are not to be construed as limitations to the present invention.

Figure 2:
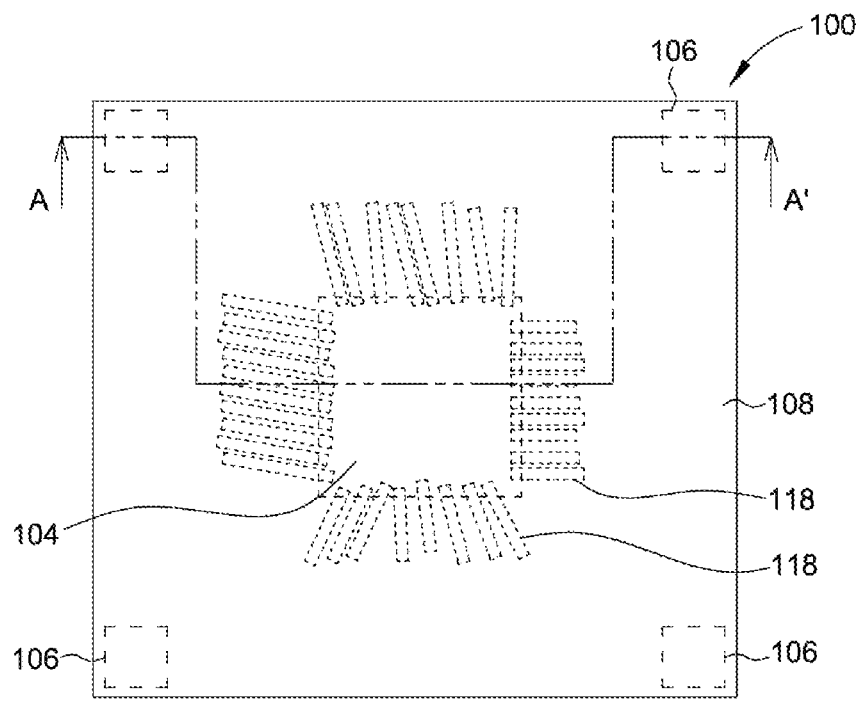
FIG. 2 is a schematic top view of a chip package structure according to an embodiment of the present invention.
Figure 3:
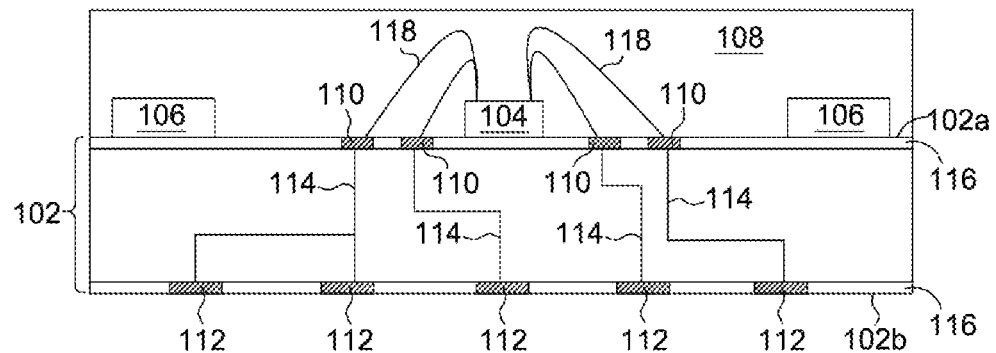
FIG. 3 is a schematic section view along a section line A-A' in FIG. 2.

FIG. 2 shows a schematic top view of a chip package structure according to an embodiment of the present invention. FIG. 3 shows a schematic section view along a section line A-A' in FIG. 2. As shown in FIG. 2 and FIG. 3, the chip package structure 100 includes a substrate 102, at least one die 104, a plurality of warpage retainers 106 and an encapsulant 108. The substrate 102 has an upper surface 102a and a lower surface 102b that are opposite. The die 104 and the warpage retainers 106 are provided on the upper surface 102a of the substrate 102, and the encapsulant 108 covers the upper surface 102a of the substrate 102, the die 104 and the warpage retainers 106. In this embodiment, the substrate 102 may be, for example, a circuit board, for electrically connecting the die 104 to other devices. For example, a plurality of bonding pads 110 may be provided at the upper surface 102a of the substrate 102, and a plurality of conductive pads 112 may be provided at the lower surface 102 of the substrate 102. Further, a plurality of wires 114 may be provided in the substrate 102 to electrically connect the bonding pads 110 to the conductive pads 112. For example, the wires 114 may be formed by a conductive layer and conductive vias in the substrate 102. According to different actual requirements, the bonding pads 110 may be electrically connected in different ways to the conductive pads 112. The wires shown in FIG. 3 are only an example, and the electrical connection between the bonding pads and the conductive pads is not limited thereto. Further, a protective layer 116 may be provided at each of the upper surface 102a and the lower surface 102b of the substrate 102, so as to avoid unnecessary electrical connections of devices provided at the upper surface 102a and the lower surface 102b of the substrate 102 to the wires 114 in the substrate 102. In another embodiment, the substrate 102 may be an insulation substrate without any wires.

Figure 4:
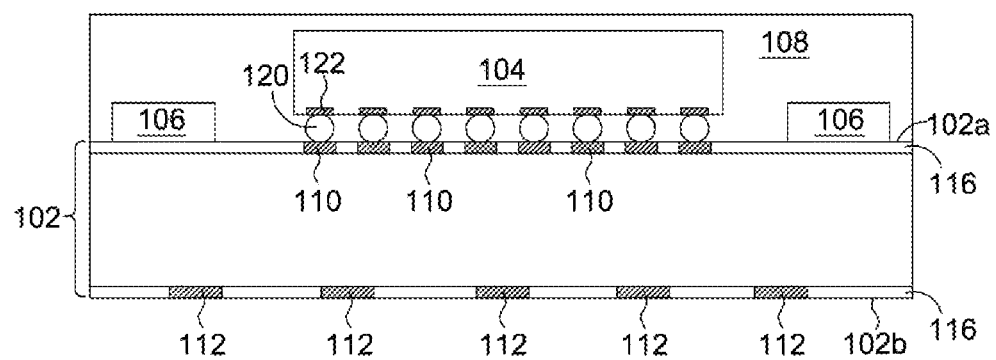
FIG. 4 is a schematic section view of a chip package structure according to another embodiment of the present invention.

The die 104 may be, for example, an integrated circuit chip having a specific function or a semiconductor chip having other functions, and may be electrically connected to the substrate 102 via the bonding pads 110 of the substrate 102. In this embodiment, the die 104 and the substrate 102 are electrically connected by means of wire bonding. As shown in FIG. 3, the chip package structure 100 further includes a plurality of bonding wires 118 connected between the bonding pads 110 and the die 104, allowing the die 104 to be electrically connected to the substrate 102 via the bonding wires 118. However, the electrical connection between the die 104 and the substrate 102 is not limited to the above method. In another embodiment, the die 104 and the substrate 102 are electrically connected by means of flip-chip. As shown in FIG. 4, the die 104 may further include a plurality of bumps 120 provided and adhered below the bonding pads 122 of the die 104, such that the die 104 may be electrically connected to the bonding pads 110 via the bumps 120.

The encapsulant 108 encapsulates the die 104 and the warpage retainers 106 on the substrate 102. In this embodiment, the encapsulant 108 includes a molding compound. For example, the molding compound may include epoxy and filler in the epoxy. For example, the filler may be aluminum oxide and silica to enhance the heat dissipation effect. The dimension of the filler may be, for example, smaller than 15 μm. The molding compound is not limited to the above, and the epoxy may be added with other materials.

The warpage retainers 106 are provided at at least one corner of the upper surface 102a of the substrate 102, and are for retaining warpage caused by a high-temperature process performed on the chip package structure 100. Under high-temperature conditions, corners or edges of a conventional chip package structure are positions with largest extents of warpage. Therefore, in this embodiment, as shown in FIG. 2, the chip package structure 100 includes four warpage retainers 106, which are respectively provided at four corners of the upper surface 102a. For example, when the temperature rises from 25° C. to 260° C. and drops to 25° C., a warpage height at a corner of a conventional chip package structure is as high as 5.5 mil, whereas a warpage height of a corner of the chip package structure 100 provided with the warpage retainers 106 is reduced to as low as 2.4 mil.

In this embodiment, the warpage retainers 106 are passive devices and usually do not have physical functions. More specifically, the warpage retainers 106 may be produced in a manufacturing process of a passive device, and are not manufactured particularly by a new or additional manufacturing process. Further, material costs of passive devices are quite low. Therefore, without increasing a greater amount of production costs, warpage caused by high temperature can be retained through the warpage retainers 106. In other embodiments, the warpage retainers 106 may also be semiconductor dies or metal. To avoid any influence on the operation of the chip package structure 100, the warpage retainers 106 are usually insulated from the substrate 102. To obtain a better warpage retaining effect, a ratio of the total area of the warpage retainers 106 to the area of the upper surface 102a may be greater than 4%, and a ratio of the area of each warpage retainer 106 to the area of the upper surface 102a may be greater than 1%. In this embodiment, the areas of the warpage retainers 106 are equal; however, the present invention is not limited to the above example.

Figure 5:
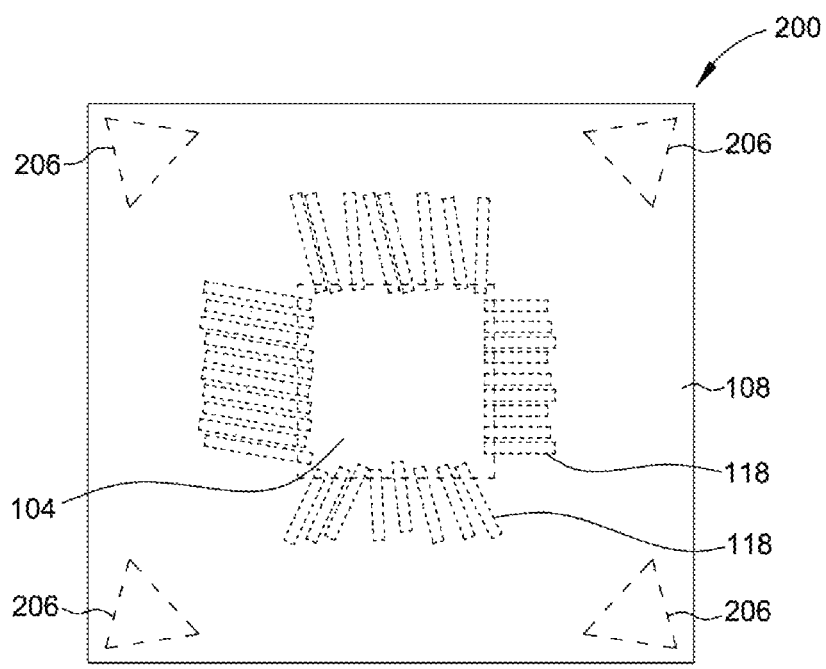
FIG. 5 is a schematic top view of a chip package structure according to another embodiment of the present invention.

In the embodiment in FIG. 2, the shape of the warpage retainers 106 viewed from the top is rectangular; however, the present invention is not limited thereto. In another embodiment shown in FIG. 5, the shape of the warpage retainers 106 viewed from the top may be triangular, and an apex of each warpage retainer 106 may face, for example, the corners of the upper surface 102a, so as to provide the substrate 102 with a larger utilization space.

Figure 6:
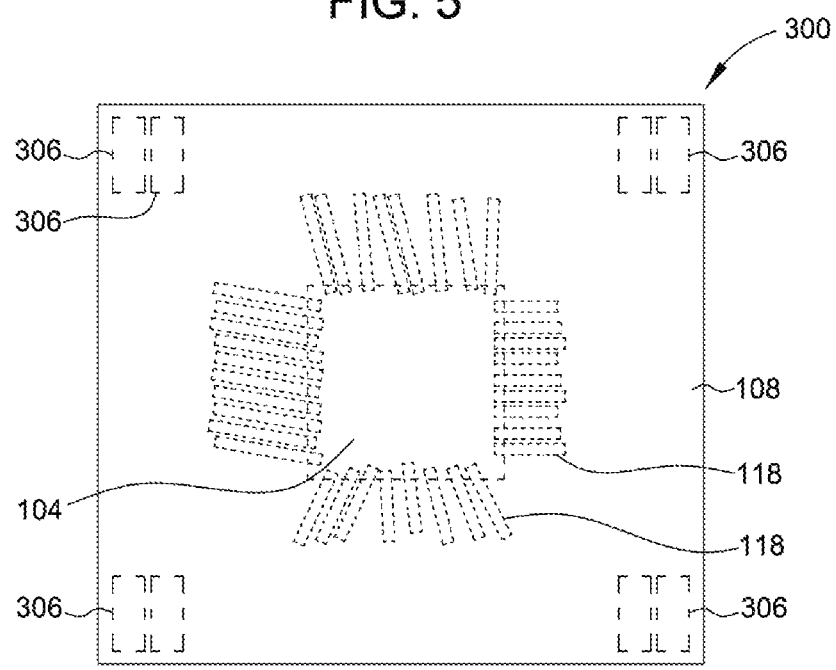
FIG. 6 is a schematic top view of a chip package structure according to another embodiment of the present invention.
Figure 7:
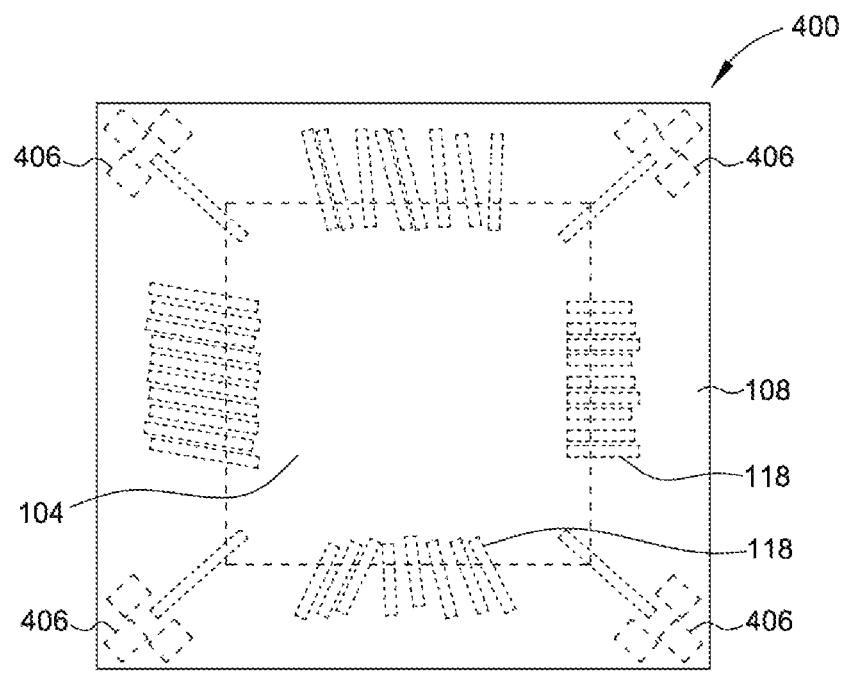
FIG. 7 is a schematic top view of a chip package structure according to yet another embodiment of the present invention.

In the embodiment in FIG. 2, one warpage retainer 106 is provided at each corner; however, the present invention is not limited thereto. In yet another embodiment in FIG. 6, two warpage retainers 306 may be provided at the same corner. In yet another embodiment of the present invention in FIG. 7, three warpage retainers 406 may be provided at the same corner. When the die 104 is in a larger size, in order to avoid the die 104, the arrangement of the warpage retainers 406 may have a recess to accommodate the corners of the die 104 or the bonding wires 118.

Figure 8:
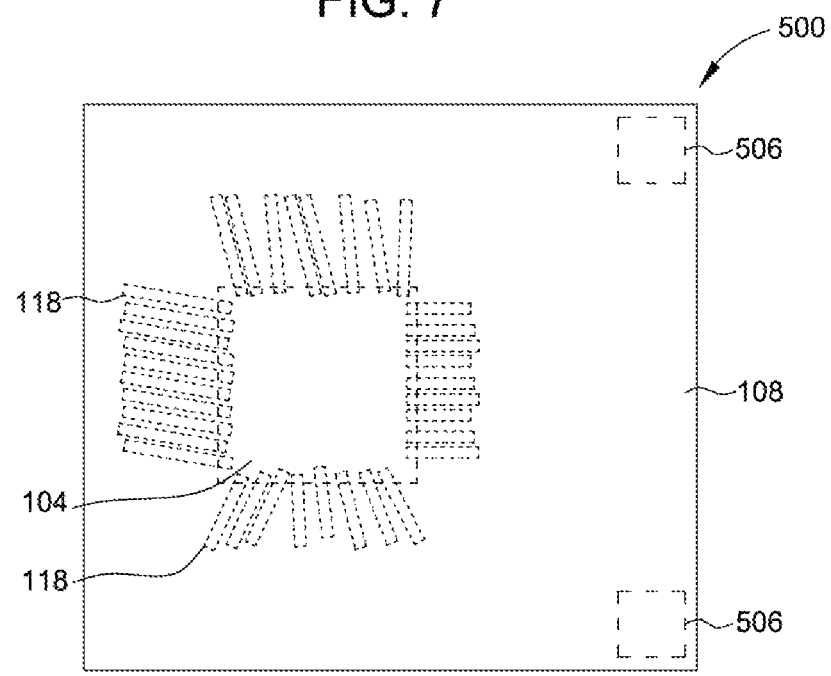
FIG. 8 is a schematic section view of a chip package structure according to yet another embodiment of the present invention.

In the embodiment in FIG. 2, all of the four corners of the substrate 102 are each provided with one of the warpage retainers 106; however, the present invention is not limited thereto. In yet another variation embodiment in FIG. 8, the center of a die 504 deviates towards one side of the substrate 102, and so only two adjacent corners at the other side of the substrate 102 are each provided with a warpage retainer 506.

In conclusion, in the chip package structure of the present invention, by providing warpage retainers at corners, warpage caused by a high temperature can be retained, thereby preventing air welding or bridging, and thus further from damage or malfunction of the die in the chip package structure.

While the invention has been described by way of example and in terms of the embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip package structure, comprising:
    a substrate, having a surface;
    a die, provided on the surface of the substrate;
    a plurality of warpage retainers, provided at at least one corner of the surface of the substrate, wherein the plurality of warpage retainers are electrically insulated from the substrate and/or the die; and
    an encapsulant, covering the surface of the substrate, the die and the plurality of warpage retainers.

2. The chip package structure according to claim 1, wherein the plurality of warpage retainers comprise four warpage retainers respectively provided at four corners of the surface.

3. The chip package structure according to claim 2, wherein the four warpage retainers are triangular.

4. The chip package structure according to claim 3, wherein an apex of each of the four warpage retainers faces the respective corner.

5. The chip package structure according to claim 1, wherein at least two of the plurality of warpage retainers are provided at one corner of the surface.

6. The chip package structure according to claim 5, wherein the corner of the surface is provided with three warpage retainers.

7. The chip package structure according to claim 6, wherein the three warpage retainers are in an arrangement having a recess to accommodate corners of the die or a bonding wire.

8. The chip package structure according to claim 7, wherein the three warpage retainers are rectangular.

9. The chip package structure according to claim 1, wherein the plurality of warpage retainers comprise only two warpage retainers respectively provided at two adjacent corners of the surface.

10. The chip package structure according to claim 1, wherein a ratio of an area of each of the plurality of warpage retainers to an area of the surface is greater than 1%.

11. The chip package structure according to claim 1, wherein a ratio of a total area of the plurality of warpage retainers to an area of the surface is greater than 4%.

12. The chip package structure according to claim 1, wherein each of the plurality of warpage retainers is a passive device.

* * * * *